(12) United States Patent
Hayes et al.

(10) Patent No.: US 9,742,598 B2
(45) Date of Patent: Aug. 22, 2017

(54) SYSTEM INFORMATION CONVOLUTIONAL DECODING

(71) Applicant: Intel IP Corporation, Santa Clara, CA (US)

(72) Inventors: Matthew Hayes, Radebeul (DE); Gwang-Hyun Gho, Cupertino, CA (US)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 14/973,994

(22) Filed: Dec. 18, 2015

(65) Prior Publication Data

US 2017/0180164 A1    Jun. 22, 2017

(51) Int. Cl.
*H04L 25/03* (2006.01)
*H04L 1/00* (2006.01)

(52) U.S. Cl.
CPC ...... *H04L 25/03286* (2013.01); *H04L 1/0054* (2013.01); *H04L 1/0059* (2013.01)

(58) Field of Classification Search
CPC H04L 25/03286; H04L 1/0054; H04L 1/0059
See application file for complete search history.

(56) References Cited

U.S. PATENT DOCUMENTS

| | | | | |
|---|---|---|---|---|
| 6,877,132 B1* | 4/2005 | De | | H03M 13/23 714/795 |
| 2008/0056400 A1* | 3/2008 | Hedayat | | H03M 13/3994 375/265 |
| 2009/0103659 A1* | 4/2009 | Chen | | H03M 13/413 375/341 |
| 2010/0260156 A1* | 10/2010 | Lee | | H04W 56/0035 370/336 |
| 2011/0099455 A1* | 4/2011 | Kamuf | | H03M 13/3723 714/755 |
| 2011/0255631 A1* | 10/2011 | Pi | | H03M 13/09 375/295 |
| 2013/0010715 A1* | 1/2013 | Dinan | | H04W 72/0406 370/329 |
| 2013/0023267 A1* | 1/2013 | Ong | | H04W 48/10 455/435.1 |
| 2013/0114766 A1* | 5/2013 | Mueller-Weinfurtner | | H03M 13/3994 375/341 |
| 2013/0294547 A1* | 11/2013 | Lane | | H04L 1/0036 375/340 |

* cited by examiner

*Primary Examiner* — Kenneth Lam
(74) *Attorney, Agent, or Firm* — Viering, Jentschura & Partner mbB

(57) ABSTRACT

A mobile communication device may include a radio transceiver configured to transmit and receive communication signals, and a baseband modem circuit configured to determine a decoded information field of a first encoded system information packet, set one or more bits of the decoded information field as an initial encoder state of a convolutional decoder for decoding the first encoded system information packet, decode the first encoded system information packet with the initial encoder state to obtain a first decoded system information packet, and use the decoded system information packet to transmit or receive data with one or more network cells.

19 Claims, 11 Drawing Sheets

SYSTEM INFORMATION CONVOLUTIONAL DECODING

TECHNICAL FIELD

Various embodiments relate generally to mobile communication devices and methods for convolutional Master Information Block (MIB) decoding.

BACKGROUND

In Long Term Evolution (LTE) networks, user terminals may need to receive and decode system information contained in Master Information Blocks (MIBs) in order to access network cells. User terminals may rely on received MIBs received from network base stations on the Physical Broadcast Channel (PBCH) in order to determine essential information including system bandwidth configuration, transmit antenna configuration, control channel configuration, system timing information, etc. User terminals may require such system information during cell search and selection procedures, and accordingly MIB reception and decoding may be an essential component of LTE communication protocols.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
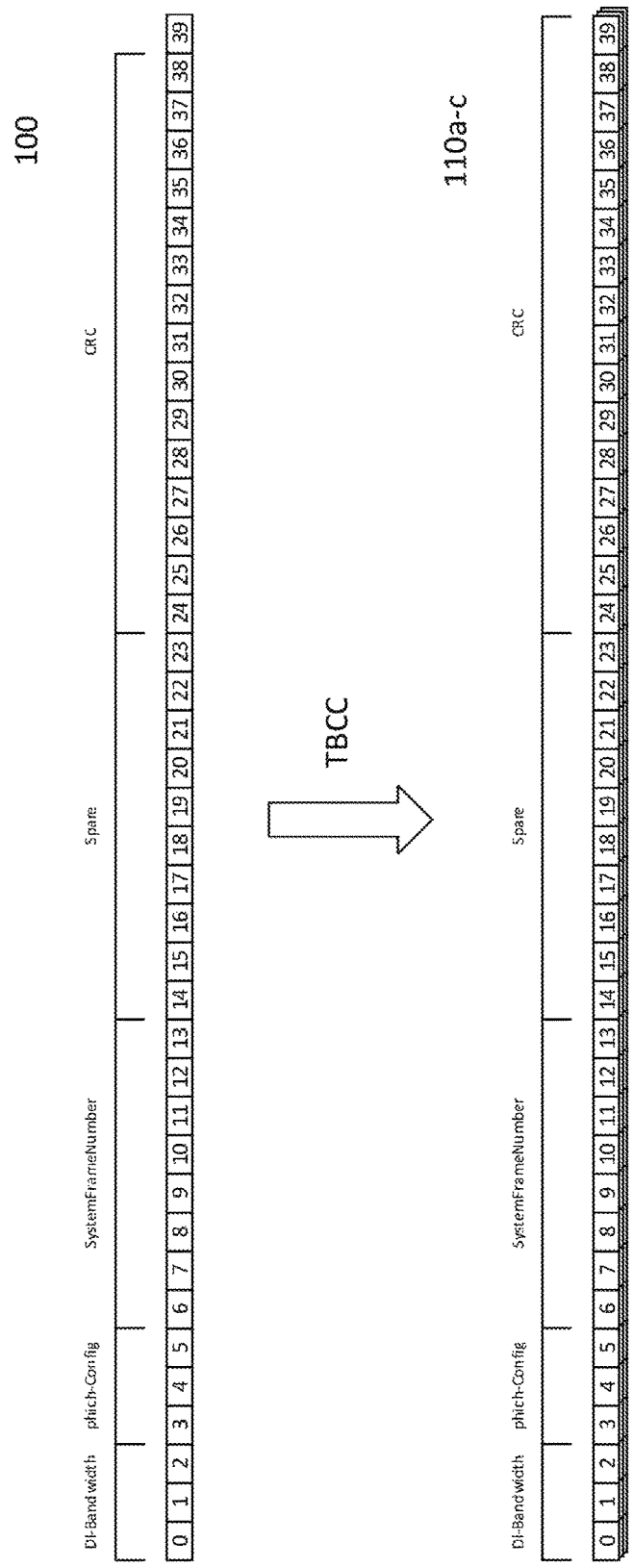
FIG. 1 shows a bit-level representation of an MIB and an encoded MIB.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The words "plural" and "multiple" in the description and the claims expressly refer to a quantity greater than one. Accordingly, any phrases explicitly invoking the aforementioned words (e.g. "a plurality of [objects]", "multiple [objects]") referring to a quantity of objects expressly refers more than one of the said objects. The terms "group (of)", "set [of]", "collection (of)", "series (of)", "sequence (of)", "grouping (of)", etc., and the like in the description and in the claims, if any, refer to a quantity equal to or greater than one, i.e. one or more.

It is appreciated that any vector and/or matrix notation utilized herein is exemplary in nature and is employed solely for purposes of explanation. Accordingly, it is understood that the approaches detailed in this disclosure are not limited to being implemented solely using vectors and/or matrices, and that the associated processes and computations may be equivalently performed with respect to sets, sequences, groups, etc., of data, observations, information, signals, etc. Furthermore, it is appreciated that references to a "vector" may refer to a vector of any size or orientation, e.g. including a 1×1 vector (e.g. a scalar), a 1×M vector (e.g. a row vector), and an M×1 vector (e.g. a column vector). Similarly, it is appreciated that references to a "matrix" may refer to matrix of any size or orientation, e.g. including a 1×1 matrix (e.g. a scalar), a 1×M matrix (e.g. a row vector), and an M×1 matrix (e.g. a column vector).

A "circuit" as user herein is understood as any kind of logic-implementing entity, which may include special-purpose hardware or a processor executing software. A circuit may thus be an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions which will be described below in further detail may also be understood as a "circuit". It is understood that any two (or more) of the circuits detailed herein may be realized as a single circuit with substantially equivalent functionality, and conversely that any single circuit detailed herein may be realized as two (or more) separate circuits with substantially equivalent functionality. Additionally, references to a "circuit" may refer to two or more circuits that collectively form a single circuit.

As used herein, "memory" may be understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, it is appreciated that registers, shift registers, processor registers, data buffers, etc., are also embraced herein by the term memory. It is appreciated that a single component referred to as "memory" or "a memory" may be composed of more than one different type of memory, and thus may refer to a collective component comprising one or more types of memory. It is readily understood that any single memory component may be separated into multiple collectively equivalent memory components, and vice versa. Furthermore, while memory may be depicted as separate from one or more other components (such as in the drawings), it is understood that memory may be integrated within another component, such as on a common integrated chip.

The term "base station" used in reference to an access point of a mobile communication network may be understood as a macro base station, micro base station, Node B, evolved NodeBs (eNB), Home eNodeB, Remote Radio Head (RRH), relay point, etc. As used herein, a "cell" in the context of telecommunications may be understood as a sector served by a base station. Accordingly, a cell may be a set of geographically co-located antennas that correspond to a particular sectorization of a base station. A base station may thus serve one or more cells (or sectors), where each cell is characterized by a distinct communication channel. Furthermore, the term "cell" may be utilized to refer to any of a macrocell, microcell, femtocell, picocell, etc.

For purposes of this disclosure, radio communication technologies may be classified as one of a Short Range radio communication technology, Metropolitan Area System radio communication technology, or Cellular Wide Area radio communication technology. Short Range radio communication technologies include Bluetooth, Wireless Local Area Network (WLAN, e.g. according to any IEEE 802.11 standard), and other similar radio communication technologies. Metropolitan Area System radio communication technologies include Worldwide Interoperability for Microwave Access (WiMax) (e.g. according to an IEEE 802.16 radio communication standard, e.g. WiMax fixed or WiMax mobile) and other similar radio communication technologies. Cellular Wide Area radio communication technologies include Global System for Mobile Communications (GSM), Universal System for Mobile UMTS, LTE, LTE-Advanced (LTE-A), CDMA, WCDMA, LTE-A, General Packet Radio Service (GPRS), Enhanced Data Rates for GSM Evolution (EDGE), High Speed Packet Access (HSPA), HSPA Plus (HSPA+), and other similar radio communication technologies. It is understood that exemplary scenarios detailed herein are demonstrative in nature, and accordingly may be similarly applied to various other mobile communication technologies, both existing and not yet formulated, particularly in cases where such mobile communication technologies share similar features as disclosed regarding the following examples.

The term "network" as utilized herein, e.g. in reference to a communication network such as a mobile communication network, encompasses both an access section of a network (e.g. a radio access network (RAN) section) and a core section of a network (e.g. a core network section). The term "radio idle mode" or "radio idle state" used in reference to a mobile terminal refers to a radio control state in which the mobile terminal is not allocated at least one dedicated communication channel of a mobile communication network. The term "radio connected mode" or "radio connected state" used in reference to a mobile terminal refers to a radio control state in which the mobile terminal is allocated at least one dedicated uplink communication channel of a mobile communication network.

Unless explicitly specified, the term "transmit" encompasses both direct and indirect transmission. Similarly, the term "receive" encompasses both direct and indirect reception unless explicitly specified.

User terminals in Long Term Evolution (LTE) networks may need to receive system information contained in a Master Information Block (MIB) in order to interact with network cells, and may in particular apply MIB system information during cell search and selection procedures. Network cells (e.g. a cell of an evolved NodeBs or eNodeBs in an LTE context) may periodically broadcast MIBs on the Physical Broadcast Channel (PBCH), which may be subsequently received and decoded by user terminals. Each MIB may be 40 bits in length, and may include information regarding the system bandwidth, acknowledgement configuration (Physical Hybrid Automatic Repeat Request (HARQ) Indicator Channel (PHICH) configuration), system timing information, error checks, and additional leftover bit positions reserved for later use. FIG. 1 shows a bit-level diagram of MIB 100, where (from left to right) MIB 100 may contain a downlink system bandwidth field (3 bits), PHICH configuration field (3 bits), System Frame Number (SFN) field (8 bits), spare field (10 bits), and a Cyclic Redundancy Check (CRC) field (16 bits).

A network cell may encode an MIB before transmission, which may provide error-correcting functionality to assist user terminals in accurately identifying the information contained in the MIB. In particular, the $3^{rd}$ Generation Partnership Project (3GPP) has specified the use of Tail-Biting Convolutional Coding (TBCC) for MIB encoding in an LTE context, where a transmitting cell may apply TBCC to the original 40-bit MIB to produce a resulting TBCC-encoded MIB (such as e.g. three 40-bit parity sequences where each MIB bit produces three parity bits (one per 40-bit parity sequence)). A user terminal may need to receive and decode an MIB during cell search and selection procedures. User terminals may then apply the decoded MIB information to interact with a cell, which may include receiving further system information as part of cell search and selection and subsequently establishing a connection with the cell. As will be detailed, a user terminal may be able to exploit properties of MIB encoding in order to optimize MIB decoding, in particular for decoding MIBs received from time-synchronized cells. A user terminal may be able to identify decoded system information fields of one or more encoded MIBs and apply the decoded system information fields as a priori information to optimize MIB decoding, such as for an initial encoder state of a Viterbi decoder as will be detailed below.

Figure 2:
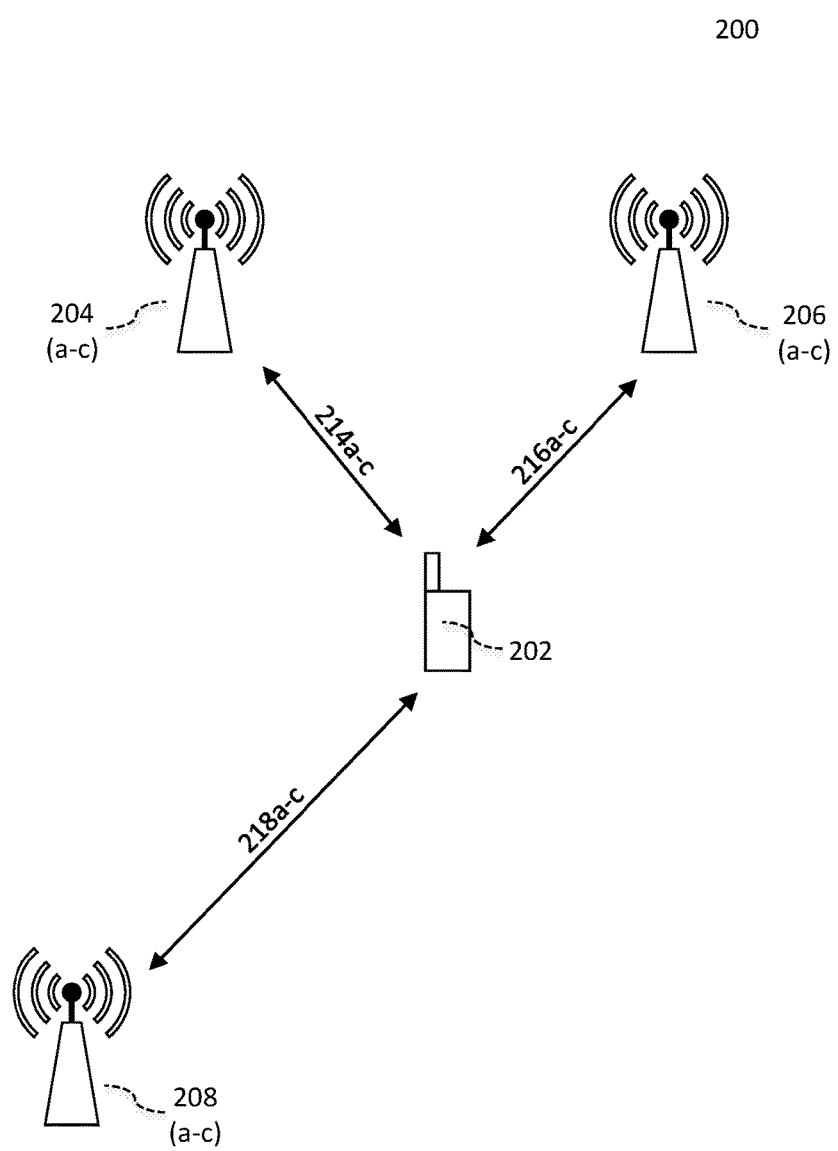
FIG. 2 shows a mobile communication network.

FIG. 2 shows mobile communication network 200, which may include mobile terminal 202 and base stations 204-208. Each of base stations 204-208 may be sectorized to form multiple cells as cells 204a-204c, 206a-206c, and 208a-208c where each cell of base stations 204-208 provides a distinct communication channel between a given mobile terminal and the corresponding base station as wireless channels 214a-214c, 216a-216c, and 218a-218c.

Figure 3:
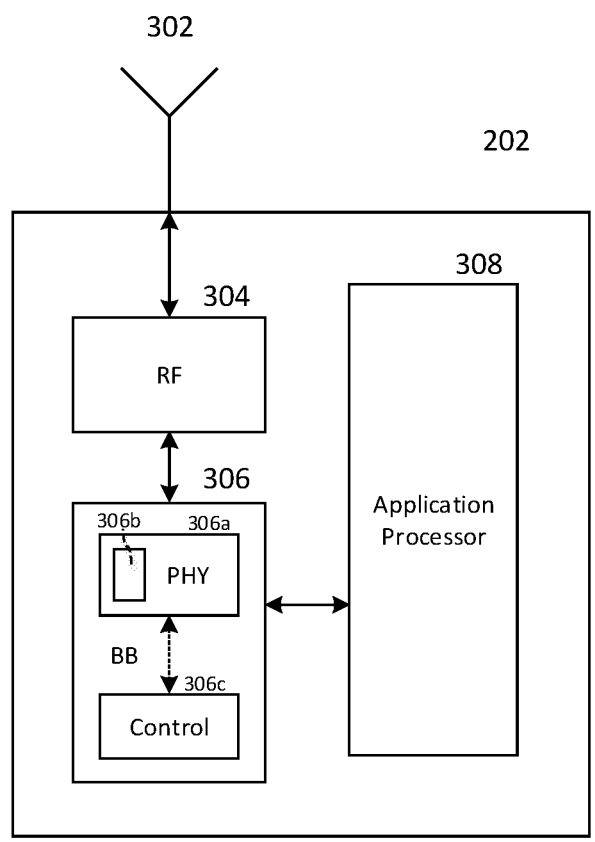
FIG. 3 shows an internal configuration of a mobile communication terminal.

FIG. 3 shows an internal configuration of mobile terminal 202. As shown in FIG. 3, mobile terminal 202 may include antenna system 302, radio frequency (RF) transceiver 304, baseband modem 306, and application processor 308. Although not explicitly shown in FIG. 3, mobile terminal 202 may include additional components including hardware, software, or firmware elements such as processors/microprocessors, controllers/microcontrollers, memory, other specialty or generic hardware/processors/circuits, etc., in order to support a variety of additional operations. Mobile terminal 202 may also include a variety of user input/output devices (display(s), keypad(s), touchscreen(s), speaker(s), external button(s), camera(s), microphone(s), etc.), peripheral device(s), memory, power supply, external device interface(s), subscriber identify module(s) (SIM), etc.

As will be detailed, in an aspect of the disclosure mobile terminal 202 may be a mobile communication device including a radio transceiver (RF transceiver 304) configured to transmit and receive communication signals, and a baseband modem circuit (baseband modem 306) configured to determine a decoded information field of a first encoded system information packet, set one or more bits of the decoded information field as an initial encoder state of a convolutional decoder for decoding the first encoded system information packet, decode the first encoded system information packet with the initial encoder state to obtain a first decoded system information packet, and use the decoded system information packet to transmit or receive data with one or more network cells. Alternatively, mobile terminal 202 may be a mobile communication device including a radio transceiver configured to receive a plurality of encoded system information packets, and a baseband modem circuit configured to identify a decoded system information field of a first encoded system information packet of the plurality of encoded system information packets, set a decoder state for decoding a second encoded information packet of the plurality of encoded system information packets according to the decoded system information field, and decode the second encoded information packet with the decoder state to obtain a decoded system information packet.

In an abridged overview of the operation of mobile terminal 202, RF transceiver 304 may receive radio frequency wireless signals via antenna system 302, which may be implemented as e.g. a single antenna or an antenna array composed of multiple antennas. RF transceiver 304 may include various reception circuitry components, which may include analog circuitry configured to process externally received signals such as e.g. mixing circuity to convert externally received radio frequency signals to baseband and/or intermediate frequencies. RF transceiver 304 may also include amplification circuitry to amplify externally received signals, such as power amplifiers (PAs) and/or Low Noise Amplifiers (LNAs), although it is appreciated that such components may also be implemented separately. RF transceiver 304 may additionally include various transmission circuitry components configured to transmit internally received signals, such as e.g. baseband and/or intermediate frequency signals provided by baseband modem 306, which may include mixing circuitry to modulate internally received signals onto one or more radio frequency carriers and/or amplification circuitry to amplify internally received signals before transmission. RF transceiver 304 may provide such signals to antenna system 302 for wireless transmission. Further references herein to reception and/or transmission of wireless signals by mobile terminal 202 may thus be understood as an interaction between antenna system 302, RF transceiver 304, and baseband modem 306 as detailed herein.

Baseband modem 306 may be configured to direct radio communications of mobile terminal 202. Although the following description may focus on the use of a single radio access technology, it is appreciated that mobile terminal 202 may be configured to operate according to multiple radio access technologies, such where with antenna system 302, RF transceiver 304, and/or baseband modem 306 are configured as "multi-mode" components and/or where separate antenna systems, RF transceivers, and/or baseband modems are provided for each supported radio access technology.

In accordance with an LTE context, baseband modem 306 may be configured to control wireless communications on an LTE network, and accordingly may be configured to support one or more network connections with one or more network access points (e.g. network cells) according to an LTE protocol stack. Accordingly, control circuit 306c may be a microprocessor or microcontroller configured to retrieve program code (from a memory, not explicitly shown in FIG. 3) and execute the program code as protocol stack software and/or firmware modules, which may specify certain protocol stack instructions unique to each layer of the protocol stack. Control circuit 306c may thus be configured to execute various arithmetic, logical, control, and input/output (I/O) operations defined by the protocol stack instructions, and may accordingly maintain one or more network connections over the LTE network.

In addition to the protocol stack software and/or firmware modules, control circuit 306c may be configured to retrieve and execute program code as physical layer control software and/or firmware modules, which control circuit 306c may apply to control physical (PHY) circuit 306a in accordance with control logic provided by the physical layer control software and/or firmware modules. PHY circuit 306a may thus be configured to perform physical layer processing on signals received from RF transceiver 304 and signals destined for transmission by RF transceiver 304. PHY circuit 306a may thus be configured to perform various physical layer processing including modulation, equalization, multiplexing, etc., which PHY circuit 306a may perform upon request by control circuit 306c. Although control circuit 306c is depicted as a single component, control circuit 306c may alternatively be implemented as separate protocol stack and physical layer control circuits.

As shown in FIG. 3, PHY circuit 306a may include decoder circuit 306b. Decoder circuit 306b may be configured to perform decoding of input signals available at PHY circuit 306a, such as on signals received from various network access points (via antenna system 302, RF transceiver 304, and one or more additional components of PHY circuit 306a), and may similarly be controlled via control circuit 306c. As will be detailed, decoder circuit 306b may be configured as a convolutional decoder, such as a Viterbi decoder for decoding TBCC-encoded signals including MIBs. Although not shown in FIG. 3, PHY circuit 306a may be composed of multiple circuits including decoder circuit 306b, where each circuit of PHY circuit 306a may be configured to perform specific physical layer processing operations.

Application processor 308 may be implemented as a Central Processing Unit (CPU), and may be configured to execute various applications and/or programs of mobile terminal 202, such as e.g. applications corresponding to program code stored in a memory component of mobile terminal 202 (not explicitly shown in FIG. 3). Application processor 308 may also be configured to control one or more further components of mobile terminal 202, such as user input/output devices (display(s), keypad(s), touchscreen(s), speaker(s), external button(s), camera(s), microphone(s), etc.), peripheral devices, memory, power supply, external device interfaces, etc.

Returning to the scenario of FIG. 2, mobile terminal 202 may thus receive an MIB from a cell, such as e.g. cell 204a, which as previously detailed may have previously been encoded using TBCC by base station 204. Due to propagation over wireless channel 214a, the MIB may contain transmission errors in the form of "flipped" binary bits, which may as a result corrupt the MIB information if left uncorrected. Baseband modem 306 may accordingly perform TBCC decoding at decoder circuit 306b on the received encoded MIB in order to correct such errors and recover the original MIB. Upon decoding the MIB, baseband modem 306 may proceed to read further system information received from cell 204a as System Information Blocks (SIBs), which baseband modem 306 may apply as part of cell search and selection procedures for cell 204a.

The aforementioned transmission errors may be caused by wireless noise and interference. Interference from other network cells (e.g. transmissions by any of network cells 204b-208c in the exemplary context of FIG. 2) may be particularly problematic, and may require baseband modem 206 to implement advanced interference suppression techniques in order to remove interference and successfully decode the desired information. 3GPP has addressed interference in recent LTE releases such as with enhanced inter-cell interference coordination (eICIC) in Release 10, which is primarily directed towards use in heterogeneous networks with proximate and/or overlapping macro and micro cells. eICIC systems may utilize "muted" subframes known as Almost Blank Subframes (ABSs) in synchronized cell groups in order to reduce interference between proximate cells, where certain cells may transmit such muted ABSs during pre-mapped subframes to allow other cells to perform transmissions in reduced interference conditions. Accordingly, network cells may be grouped into synchronous cell groups in order to allow for such synchronized transmissions.

While the use of ABSs may reduce interference, ABSs may not be completely muted and accordingly may still contain certain essential signals. Specifically, network cells performing ABS transmission during a given subframe may still transmit cell-specific reference signals (CRSs), Primary and Secondary Synchronization Signals (PSS and SSS), and PBCH data, which may be needed to ensure that early Release 8 or 9 compliant devices are still supported. Accordingly, a user terminal receiving a signal from a network cell performing ABS transmission may need to decode such signals in hostile interference scenarios.

As a result, the aforementioned MIB reception and decoding on the PBCH may require advanced receiver processing in order to suppress the interference of "aggressor cells" in order to allow a user terminal to decode PBCH data (MIB) from a "victim cell". User terminals may need to perform multiple detection attempts on the same received PBCH data in order to sufficiently remove interference to allow for PBCH decoding, which may include performing Successive Interference Cancelation (SIC). In a conventional SIC procedure, a receiver may receive a composite signal containing one or more conflicting signals. A receiver may then detect and reconstruct the strongest conflicting signal before subsequently canceling the strongest conflicting signal from the composite signal to obtain a composite residue signal that contains the remaining conflicting signals (minus the strongest conflicting signal). A receiver may iteratively repeat this process to subsequently detect and recover each conflicting signal.

Accordingly, a user terminal employing SIC to detect an MIB from a network cell may need to iteratively cancel conflicting signals from the other proximate cells in order to recover the desired MIB. In the case of an eICIC scenario or other similar scenario involving synchronized cells, a user terminal receiving an MIB may need to cancel conflicting MIBs transmitted simultaneously by other synchronized conflicting cells in order to recover the desired MIB. A user terminal may therefore successively cancel multiple received conflicting MIBs from a received composite signal during SIC, and thus may be able to recover and decode an MIB from the strongest conflicting cell during the first SIC iteration.

As the cells of a synchronous cell group perform synchronized transmissions, each MIB will be synchronized in time and contain an identical SFN field in MIB bits 6-13 as shown in FIG. 1. Due to the unique TBCC encoding scheme (as will be further detailed below) employed to encode MIBs, a user terminal may utilize such "common" information between multiple MIBs in order to improve decoding of the remaining synchronized MIBs. Specifically, a user terminal such as mobile terminal 202 may utilize the common SFN field identified during the first SIC iteration as a priori information to initialize an MIB decoder. By doing so, mobile terminal 202 may obtain improve decoding accuracy and reduce the computational expenditure required to decode MIBs, in particular for the latter SIC iterations.

Mobile terminal 202 may exploit a unique "circular" property of TBCC encoding to apply the identified SFN in such a manner. In a convolutional encoding scheme such as TBCC, an encoder may utilize an input bit sequence to produce a sequence of parity bits as an output. The encoder may internally hold a certain number of recent input bits at any given time as the "state" of the encoder (e.g. in one or more shift registers), where each encoder state will produce a specific parity bit output given a 0 or a 1 as the next input bit (assuming a single input bit per parity bit output stage). The number of input bits held as the encoder state is defined by the "constraint length" K, where the K−1 most recent past input bits define the encoder state at any point in time. Each of these past input bits held as the encoder state in addition to the next input bit of the input sequence will thus determine the parity bits output by the encoder. An encoder may output more than one parity bit per input bit, and accordingly may produce multiple parity bit sequences.

Figure 4:
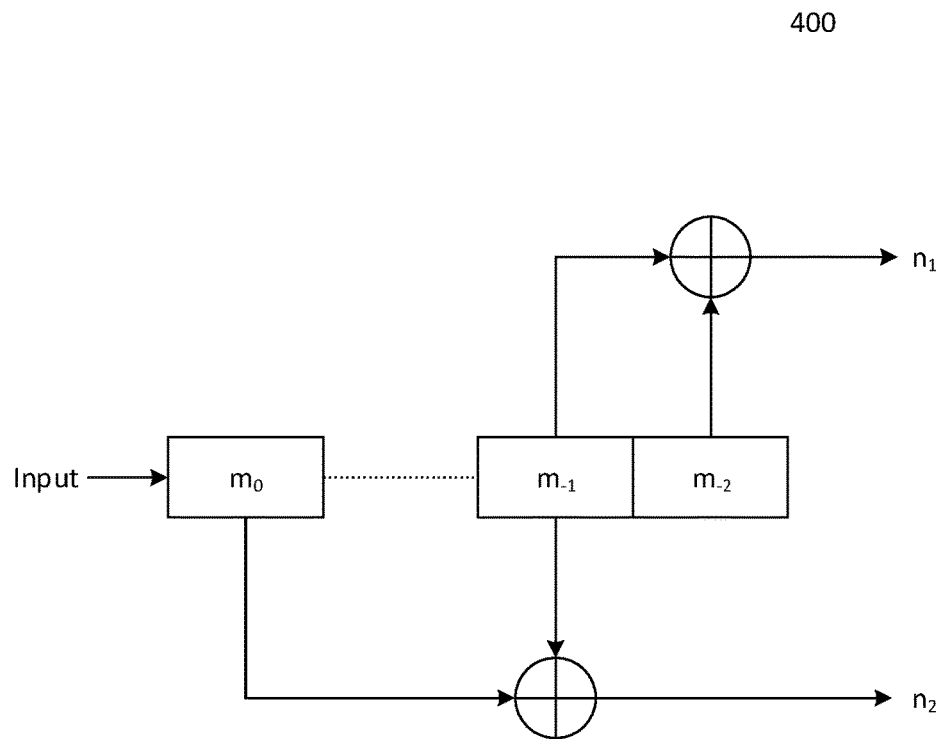
FIG. 4 shows a graphical representation of a convolutional encoder.

FIG. 4 shows a simplified example of convolutional encoder 400 with constraint length K=3 that generates n=2 parity bits ($n_1$ and $n_2$) per input bit, and thus produces two parity bit sequences (a first parity bit sequence for $n_1$ values and a second parity bit sequence for $n_2$ values). In accordance with a convolutional encoding scheme with constraint length K=3, convolutional encoder 400 may calculate each parity bit by performing an XOR operation with the encoder state bits $m_{-1}$ and $m_{-2}$ (the most recent two input bits of the input sequence) and the current input bit $m_0$ (the next input bit of the input sequence). As shown in FIG. 4, parity bits $n_1$ and $n_2$ may be calculated as e.g. $n_1=m_{-1}\oplus m_{-2}$ and $n_2=m_0\oplus m_{-1}$, which are known as the parity generator polynomials for convolutional encoder 400 and are exemplary in the context of FIG. 4. Each of $m_0$, $m_{-1}$, and $m_{-2}$ may shift to the right following each parity output (i.e. each set of parity bits output), where $m_{-2}$ is discarded, $m_{-1}$ moves to $m_{-2}$, $m_0$ moves to $m_{-1}$, and the input sequence provides the next input bit as $m_0$. Convolutional encoder 400 may then calculate the next parity bits based on the "new" encoder state ($m_{-1}m_{-2}$) and "new" input bit $m_0$. Convolutional encoder 400 may thus output two parity bit sequences, where each corresponding pair of parity bits in the two parity bit sequences corresponds to a common input bit.

The encoder state ($m_{-1}m_{-2}$) may vary over time depending on the input bits provided from the input sequence, where the encoder state may undergo "state transitions" as the state changes according to each sequential input bit. The sequence of encoder state transitions of convolutional encoder 400 over time may be referred to as a state path, where each new input bit triggers a state transition (although the encoder state may in effect remain the same for certain state transitions, e.g. where $m_0=0$, and ($m_{-1}m_{-2}$)=(0,0) triggers a state "transition" of (00)→(00)). As each encoder state bit shifts right following each parity bit output stage, there may only be two possible "next" states given a current encoder state (assuming only a single input bit per parity output as in convolutional encoder 400). For example, given a current state of ($m_{-1}m_{-2}$)=(01), the only two possible next encoder states dictated by the next input bit are (00) (if the next input bit $m_0$ is a 0) and (10) (if the next input bit $m_0$ is a 1). Such may similarly hold for each encoder state and may be exploited during decoding as part of the error-correcting nature of convolutional coding, as only certain state transitions may be considered "valid".

Figure 5:
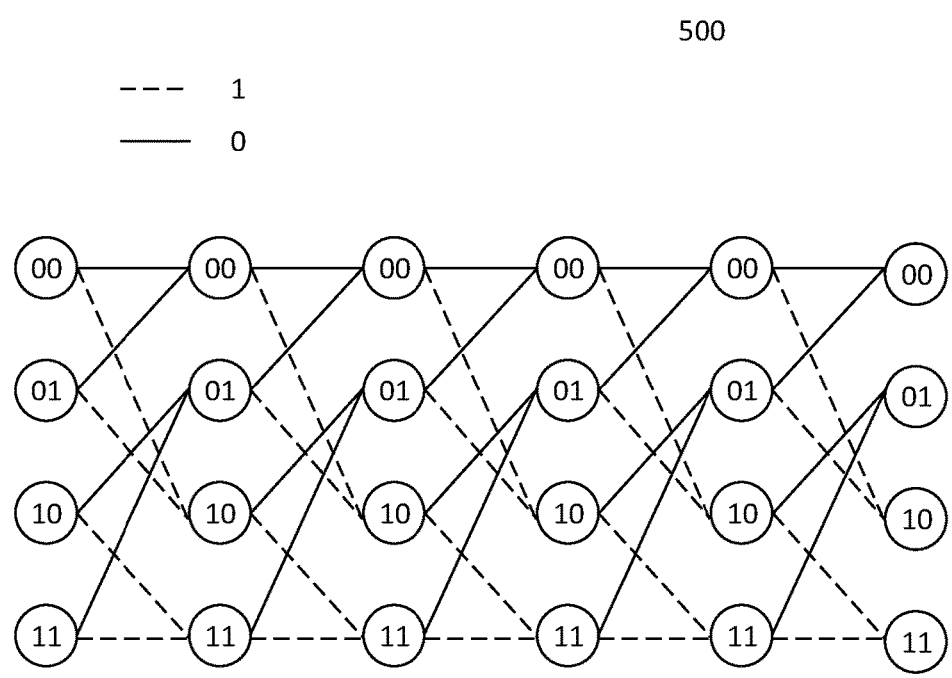
FIG. 5 shows a trellis diagram representation of a convolutional encoder.

The state transitions and state paths of convolutional encoders may be temporally represented by a trellis diagram as depicted by trellis diagram 500 as depicted in FIG. 5. Each numerically labeled circle in trellis diagram 500 may represent an encoder state $(m_{-1}m_{-2})$ of convolutional encoder 400. As previously indicated, each encoder state may only transition to two possible "next" states depending on whether the next input bit $m_0$ is a 0 or a 1, which is depicted by the dashed ($m_0=1$) and solid ($m_0=0$) transition lines in trellis diagram 500. Trellis diagram 500 thus depicts each possible state transition of convolutional encoder 400 over time, and accordingly also depicts the possible valid state transitions and state paths of convolutional encoder 400.

Each state transition of convolutional encoder 400 may produce a parity bit output according to the corresponding parity generator polynomials. For example, given an initial state of $(m_{-1}m_{-2})=(00)$, convolutional encoder 400 may produce parity bit output $(n_1n_2)=(00)$ if $m_0=0$ (and remain at (00) for the transition) and $(n_1, n_2)=(01)$ if $m_0=1$ (and transition to (10)). Such parity bit outputs $(n_1n_2)$ may be similarly calculated for each encoder state $(m_{-1}m_{-2})$ and input bit $m_0$ of convolutional encoder 400. The set of parity bit outputs over time may thus be the parity bit sequences output by convolutional encoder 400, which in the case of convolutional coder 400 may be two parity bit sequences—a first parity bit sequence for the $n_1$ parity bits and a second parity bit sequence for the $n_2$ parity bits.

Convolutional encoder 400 may thus produce one or more sequences of parity bits for a given input sequence, where convolutional encoder 400 may undergo a series of state transitions corresponding to the input sequence and the produced parity bit sequence. The parameters of convolutional encoder 400 detailed herein are exemplary, and accordingly numerous other convolutional encoders may be realized using different constraint lengths, input size (i.e. the number of simultaneous input bits), output size (i.e. the number of simultaneous parity bits outputted), parity generator polynomials, etc.

Returning to the mobile communication context of mobile communication network 200, base station 204 may encode original MIB 100 to produce encoded MIB parity big sequences 110a-110c. As specified by 3GPP, base station 204 may encode original MIB 100 with a TBCC encoder using a constraint length K=7 (thus yielding a K−1=6-bit encoder state), input size of 1, and output size of 3. Accordingly, encoded MIB parity big sequences 110a-110c may be a set of three parity bit sequences (110a, 110b, and 110c) each 40 bits in length, where the parity bits with corresponding positions in each the three parity bit sequences correspond to the same input bit of original MIB 100 as depicted in FIG. 1.

As a result of wireless propagation over wireless channel 214a, encoded MIB parity bit sequences 110a-110c as received by mobile terminal 202 may contain error, which mobile terminal 202 may correct during decoding of encoded MIB parity bit sequences 110a-110c to recover original MIB 100. Mobile terminal 202 may apply a Viterbi decoder in order to decode encoded MIB parity bit sequences 110a-110c to recover original MIB 100, such as where decoder circuit 306b is realized as a Viterbi decoder circuit.

Viterbi decoders may operate on one or more parity bit sequence, e.g. encoded MIB parity bit sequences 110a-110c, in order to determine the most likely encoder state path (i.e. the sequence of encoder state transitions) of the convolutional encoder that produced the parity bit sequences. By determining the most likely encoder state path, a Viterbi decoder may determine each input bit (as each input bit produces a specific state transition for each encoder state) corresponding to the most likely encoder state path and accordingly recover a valid input sequence, e.g. original MIB 100. As only certain state transitions are possible for each input bit of a convolutional encoder, a Viterbi decoder may be able to correct bit errors by identifying a valid state path that has the highest probabilistic match with the received parity bit sequences (which may not exactly match with a valid state path due to bit errors). Upon determining such a most likely encoder state path as part of a "forward search", a Viterbi decoder may "trace back" through the trellis in a "traceback procedure" to determine the input bit sequence that produced the most likely encoder state path, and accordingly may obtain an input bit sequence that probabilistically matches with the original input bit sequence.

In order to determine a valid encoder state path that probabilistically matches with the parity bit sequences during the forward search, a Viterbi decoder may compare the received parity bit sequences to the possible parity bit outputs (e.g. for $m_0=0$ and $m_0=1$) for each possible encoder state in the trellis. As only certain parity bit outputs are possible for each encoder state (e.g. encoder state (00) may only produce parity bit output (00) for $m_0=0$ and (01) for $m_0=1$), bit errors in the received parity bit sequences may produce "mismatches" with the valid parity bit outputs for each encoder state. Accordingly, certain encoder state transitions may be characterized as having a certain level of error (i.e. depending on how many bits of the received parity bit sequences do not match the parity output bits of the encoder state transition), and accordingly a hypothetical encoder state path that contains encoder state transitions having errors may additionally be characterized as having a certain level of error that is collectively representative of the errors of each encoder state transition of the encoder state path.

Figure 6:
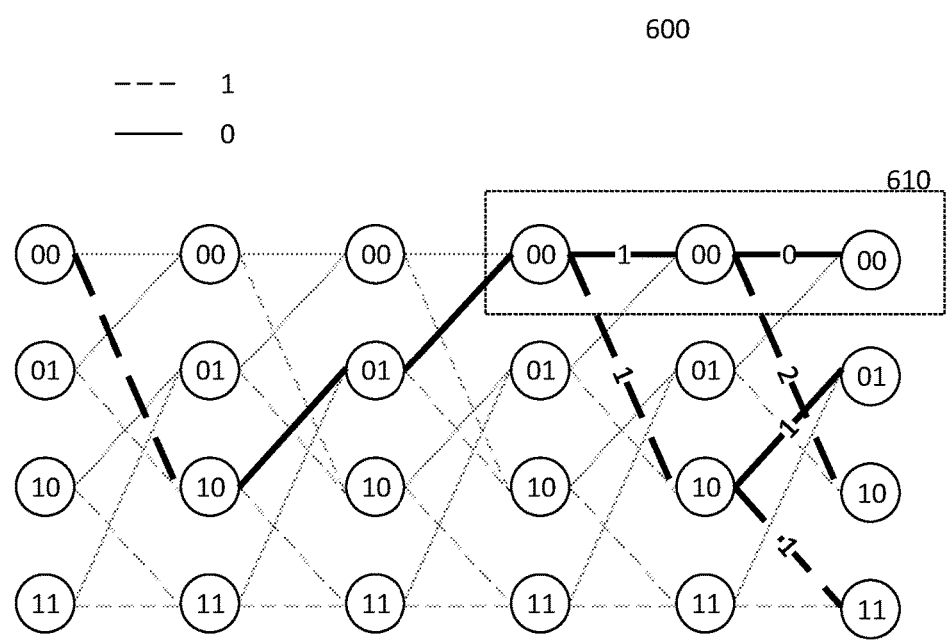
FIG. 6 shows an exemplary path selection in a trellis diagram.

A Viterbi decoder may utilize state transition error (quantified as a "branch metric") in order to identify state paths with low error (quantified as a "path metric"), and may utilize analysis of "future" encoder states to make state transition selections from "past" encoder states. Trellis diagram 600 of FIG. 6 shows such an example, in which a Viterbi decoder may calculate a branch metric of 1 for both a (00)→(10) and (00)→(00) state transition, i.e. where the parity bit outputs for the (00)→(10) and (00)→(00) transition ($m_0=0$ and $m_0=1$ respectively) both contain an error (e.g. represented by Hamming distance) of 1 from the received parity bit sequences. As both branch metrics are equal, the Viterbi decoder may not be able to select which state transition is part of the most likely state path. The Viterbi decoder may thus proceed to evaluate the parity outputs from the (00) and (10) encoder states to determine whether either the (00) or (10) encoder states produce parity bits outputs that closely match the received parity bit sequences. As shown in 610, the (00)→(00) transition may produce a parity bit output with 0 error (i.e. that matches the received parity bit sequences), while the other transitions ((00)→(10), (10)→(01), and (10)→(11)) may produce at least 1 or greater error. As the path metric for the (00)→(00)→(00) state path is only 1 compared to 3 or more for the other state paths, the Viterbi decoder may select 610 as part of the most likely encoder state path. Accordingly, the comparison of the parity bits output from "future" encoder states with the received bit sequence may allow the Viterbi decoder to make accurate state path selections, which may be utilized in TBCC coding as will be later detailed.

A Viterbi decoder may thus attempt to determine the encoder state path that has the least error (lowest path metric), i.e. the sequence of encoder state transitions that produces a parity bit sequences (according to the parity generator polynomials) that most closely matches the received parity bit sequences. In ensuring that a valid matching encoder state path is determined, a Viterbi decoder may additionally be able to correct errors during recovery of the original input bit sequence, e.g. original MIB 100. The specifics of such Viterbi decoders, both for hard and soft decoding, are well-established and will be recognized by skilled persons.

In conventional Viterbi decoding, the initial encoder state may not be known at the decoder. In other words, each possible encoder state (e.g. (00), (01), (10), and (11)) may have a uniform probability of being the initial encoder state. Accordingly, a Viterbi decoder may independently assume that each possible encoder state is the initial encoder state and determine a most likely encoder state path starting from each possible encoder state. One or more of these candidate encoder state paths may converge into a single encoder state path, i.e. where two or more candidate encoder state paths meet at a single encoder state on the trellis and subsequently proceed along the same encoder state path as all candidate encoder state paths are analyzed using the same received parity bit sequences. A Viterbi decoder may subsequently arrive at one or more remaining "survivor" paths, and may select the survivor path with the highest probability (i.e. that produces parity bit sequences that matches the received parity bit sequences with the lowest error) as the final encoder state path. Upon selecting a final encoder state path, a Viterbi decoder may identify the corresponding input bits (that trigger each state transition in the final encoder state path) to recover the original input sequence as part of the "traceback" procedure.

However, as noted above a conventional Viterbi decoder may need to independently evaluate encoder state paths from each possible encoder state as the initial encoder state. Such may include evaluating state paths from each of the $2^{K-1}$ possible encoder states, which may involve executing $2^{K-1}$ independent Viterbi decoder algorithms (one per possible starting encoder state, in serial or parallel) which has an inherently high processing cost. Both Zero-Tailed Convolutional Coding (ZTCC) and Tail-Biting Convolutional Coding (TBCC) have been introduced in order to simplify the computational complexity of Viterbi decoding by ensuring that the initial encoder state and the final encoder state are the same. In the case of ZTCC, the encoder may set the initial encoder state of the encoder to zero (e.g. $(m_{-1}m_{-2} \ldots m_{-2}K-1)=(00 \ldots 0))$ and "flush" the input sequence with a sequence of 0s in order to ensure that the final encoder state is also zero. Such may allow a Viterbi decoder receiving the parity bit sequences to consider only encoder paths that initiate and terminate at the zero encoder state, thus substantially simplifying the decoding process and the required computational complexity of the decoder. However, the rate of the encoder may be reduced due to the zero flushing at the encoder, which inherently adds extra parity bits to the parity bit sequences.

In TBCC, the encoder may ensure that the initial and final encoder state is the same, but not necessarily both the zero state. TBCC encoders may ensure matching initial and final encoder states by setting the initial K−1-bit encoder state to match the final K−1 bits of the input sequence (thus additionally requiring that the entire input sequence is known at the start of encoding in order to initialize the encoder state). As no extra bits are added by the encoder to force a final encoder state, TBCC may not result in a rate reduction. However, in contrast to ZTCC a TBCC decoder may not have exact knowledge of the initial and final encoder states and may instead only assume that the initial and final states are the same. Thus, the uniform likelihood assumption of all initial encoder states may still hold.

As the initial and final encoder states are the same, the state path of a TBCC encoder may be considered "circular". Viterbi decoders may exploit this cyclic nature of TBCC-encoded parity bit sequences in order to effectively perform decoding using the matching initial-final encoder state assumption. Specifically, a Viterbi decoder may cyclically "repeat" the received parity bit sequences and perform Viterbi decoding over the repeated received parity bit sequences as a "warm-up region" (or "left extension") in order to arrive at a likely initial encoder state at the beginning of the received parity bit sequences (where the warm-up region may be e.g. 5 times the constraint length in order to obtain convergence to the initial encoder state). Such is shown as the warm-up region of trellis diagram 700 depicted in FIG. 7, which may be formed from one or more cyclically repeated copies of the received parity bit sequences. Accordingly, the Viterbi decoder may decode from starting point 710 of the warm-up region (selected depending on the warm-up region length) to the ending point 720 of the warm-up region, which may include independent decoding from each possible encoder state over the warm-up region until eventually reaching the beginning of the received parity bit sequences 720 at the end of the warm-up region. Assuming sufficient warm-up region length, the Viterbi decoder may be able to identify a likely initial encoder state of the received parity bit sequences corresponding to a survivor path of the warm-up region (due to path convergence and/or path metric comparisons). The Viterbi decoder may then utilize this likely initial encoder state from the warm-up region for decoding of the received parity bit sequences starting at 720. Various different specific procedures may be available for selection of the warm-up region and application of the likely initial encoder state, which may vary dependent on the number of traceback lengths contained in the input sequence.

Figure 7:
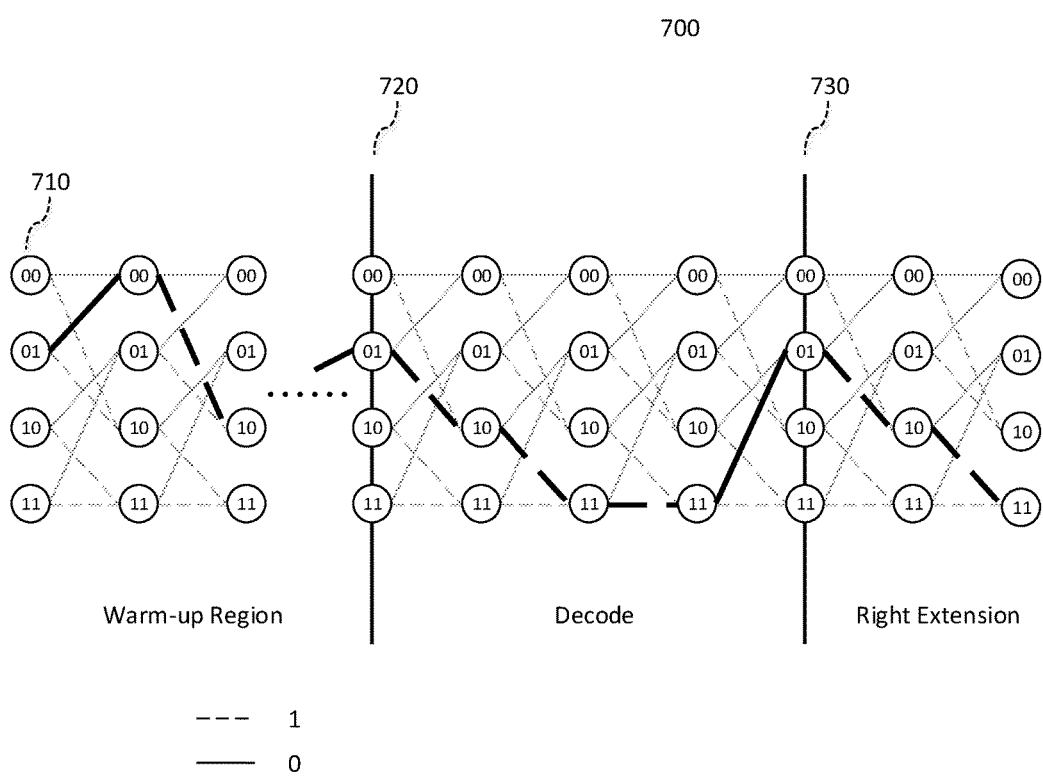
FIG. 7 shows warm-up region and right extension processing in a trellis diagram.

As the final encoder state is the same as the initial encoder state, a Viterbi decoder may utilize the likely initial encoder state for selection of the most likely encoder state path, as only encoder state paths that have matching initial and final encoder states are considered valid. In order to protect the accuracy of the final encoder states, a Viterbi decoder decoding a TBCC parity bit sequences may employ a "right extension" (as shown in FIG. 7) by similarly decoding cyclically shifted copies of the received parity bit sequences following the end of the received parity bit sequences at 730. As previously indicated, Viterbi decoders may rely on comparisons of parity bit outputs from "future" encoder states to decide on state transitions of "past" encoder states along the state path, and thus may utilize the right extension in order to ensure the accuracy of the final encoder state of the one or more surviving paths of the received parity bit sequences.

Accordingly, Viterbi decoders may decode TBCC-encoded parity bit sequences using warm-up regions and right extensions in order to identify survivor paths having matching initial and final encoder states. As the encoder may not need to insert extra bits into the parity bit sequences (as is the case of ZTCC encoding), the coding rate of TBCC may not be negatively impacted. However, as detailed regarding FIG. 7 a Viterbi decoder may need to perform extra processing in the form of warm-up region and right extension processing in order to exploit the encoder state constraints of TBCC encoding. Additionally, there remains the possibility that the initial and final state determination of the warm-up region and right extension processing will fail, thus potentially precluding the Viterbi decoder from determining a valid TBCC state path.

Returning to the mobile communication context introduced in FIG. 2, mobile terminal 202 may receive encoded MIB parity bit sequences 110a-110c from cell 204a of base station 204 over wireless channel 214a, which may be corrupted as a result of wireless transmission. Mobile terminal 202 may thus be required to perform TBCC decoding on encoded MIB parity bit sequences 110a-110c, such as with a Viterbi decoder, in order to recover original MIB 100. However, as opposed to relying on extra warm-up region and right extension processing of encoded MIB parity bit sequences 110a-110c, mobile terminal 202 may instead identify an initial encoder state and subsequently apply the initial encoder state to efficiently decode received MIB parity bit sequences. Specifically, mobile terminal 202 may be able to identify K−1=6 consecutive bits of original MIB 100 and utilize the consecutive bits as an initial encoder state. As TBCC codes are cyclical, mobile terminal 202 may be able to cyclically shift encoded MIB parity bit sequences 110a-110c and utilize any 6 consecutive bits of original MIB 100 as the initial state. While any consecutive 6 bits of original MIB 100 are applicable, mobile terminal 202 may in particular utilize the 8-bit SFN field (MIB bits 6-13), and accordingly may identify the SFN field and subsequently utilize the SFN field as an initial encoder state during Viterbi decoding. As mobile terminal 202 may thus be able to identify an accurate initial encoder state, mobile terminal 202 may not need to perform any warm-up region or right extension processing and may instead utilize perfect information to initialize the decoder.

As previously detailed, mobile terminal 202 may receive wireless radio frequency signals via antenna system 302, which may be subsequently processed by RF transceiver 304 and PHY circuit 306a under the direction of control circuit 306c. PHY circuit 306a may thus encoded MIB parity bit sequences 110a-110c by way of such processing and may provide encoded MIB parity bit sequences 110a-110c to decoder circuit 306b for convolutional decoding. Decoder circuit 306b may be configured to perform Viterbi decoding on encoded MIB parity bit sequences 110a-110c in order to recover the original MIB. The various physical realizations of Viterbi decoders, both in the form of hardware and software executed by a processor, are established and will be appreciated by skilled persons.

Figure 8:
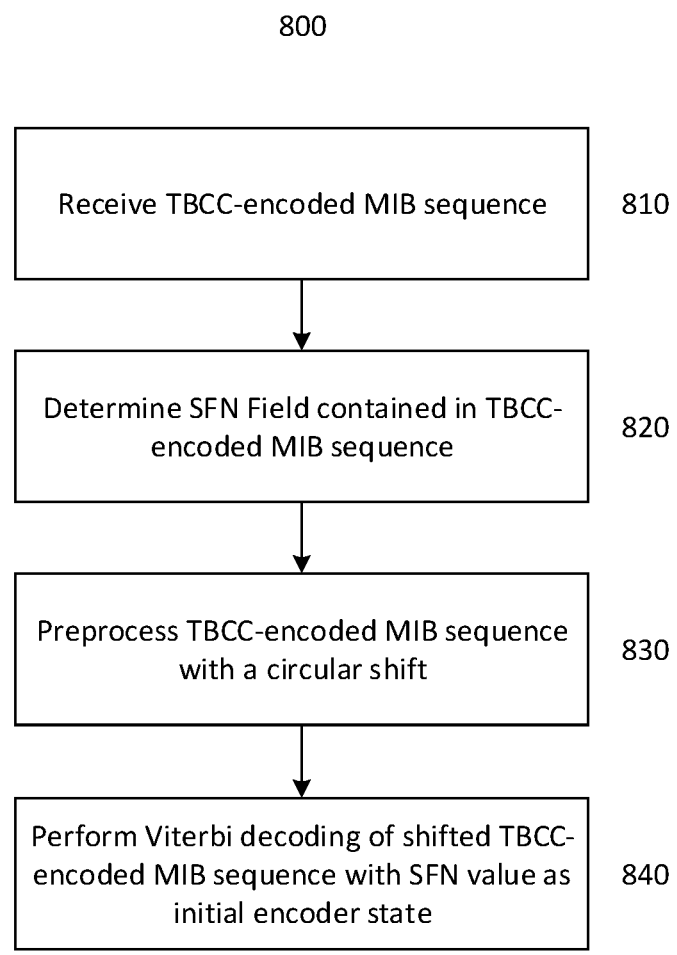
FIG. 8 shows a method for decoding encoded MIB parity bit sequences.

FIG. 8 shows method 800 for decoding TBCC-encoded MIB sequences, which decoder circuit 306b may employ on a TBCC-encoded MIB sequence. As introduced above, decoder circuit 306b may first receive encoded MIB parity bit sequences 110a-110c at 810. Specifically, mobile terminal 202 may receive encoded MIB parity bit sequences 110a-110c via antenna system 302 as part of a received wireless signal and process the received wireless signal at RF transceiver 304 and PHY circuit 306a to obtain encoded MIB parity bit sequences 110a-110c at decoder circuit 306b. Decoder circuit 306b may then determine the SFN value contained in original MIB 100, which may be contained in MIB bits 6-13 as shown in FIG. 1.

As previously detailed regarding eICIC and ABSs, mobile terminal 202 may perform MIB decoding during hostile interference scenarios where multiple synchronized cells perform simultaneous MIB PBCH transmission. For example, mobile terminal 202 may receive encoded MIB parity bit sequences 110a-110c in 810 from network cell 204a as part of a composite wireless signal that additionally contains TBCC-encoded MIB sequences from e.g. network cells 206b and 208c, where network cells 204a, 206b, and 208c may form a synchronous cell group. Accordingly, mobile terminal 202 may simultaneously receive parity bit sequences from each of network cells 204a, 206b, and 208c, e.g. three encoded MIB parity bit sequences for each of network cells 204a, 206b, and 208c (e.g. nine total) as the "composite" encoded MIB parity bit sequences.

As previously indicated, mobile terminal 202 may utilize the SFN field of the corresponding original MIB as a priori information to initialize decoding, i.e. as the initial encoder state for decoding, of the composite encoded MIB parity bit sequences. As mobile terminal 202 may not initially know the SFN field of any of the composite encoded MIB parity bit sequences, mobile terminal 202 may need to perform a "full" decode of at least one of the composite encoded MIB parity bit sequences, which may include warm-up region and right extension processing to obtain accurate initial and final encoder states as detailed above regarding Viterbi TBCC decoding. For example, mobile terminal 202 may perform an SIC procedure in order to isolate the individual encoded MIB parity bit sequences of each of network cells 204a, 206b, and 208c from the composite encoded MIB parity bit sequences. PHY circuit 306a may perform such an SIC procedure in order to iteratively isolate each of the conflicting signals, where the details of such SIC procedures will be appreciated by skilled persons.

Accordingly, during a first SIC iteration mobile terminal 202 may isolate the encoded MIB parity bit sequences from one of network cells 204a, 206b, and 208c, such as e.g. the encoded MIB parity bit sequences from network cell 206b. Decoder circuit 306b may then perform a full Viterbi TBCC decode on the encoded MIB parity bit sequences of network cell 206b (represented as encoded MIB parity bit sequences 110a-110c), and accordingly may obtain the original MIB including each of the downlink bandwidth, PHICH configuration, SFN, spare, and CRC fields of the original MIB (represented as original MIB 100).

As each of network cells 204a, 206b, and 208c is synchronized, the SFN field of the original MIB transmitted by each of network cells 204a, 206b, and 208c may be equivalent. Accordingly, decoder circuit 306b may assume that the SFN field of each of the original MIBs is identical, i.e. the composite encoded MIB parity bit sequences correspond to a original MIBs with a common SFN field. Decoding circuit 306b may thus identify the common SFN field in 820 in a first SIC iteration by decoding the encoded MIB parity bit sequences from a first cell to recover the original MIB, e.g. the encoded MIB parity bit sequences from network cell 206b. Decoder circuit 306b may then subsequently employ the identified SFN as the initial encoder state to perform Viterbi decoding on the remaining encoded MIB parity bit sequences of the composite encoded MIB parity bit sequences, e.g. for network cells 204a and 208c.

As detailed above, TBCC-encoded parity bit sequences and the corresponding encoder states may be considered "circular" or "cyclical" due to the common initial and final states. Accordingly, this circularity holds for all cyclic shifts of a TBCC-encoded parity bit sequence; in other words, a TBCC-encoded parity bit sequence may be shifted according to any possible cyclic shift and will produce matching initial and final encoder states for a subsequent decode of the cyclically shifted TBCC-encoded parity bit sequence. Furthermore, as previously detailed a TBCC encoder may obtain matching initial and final encoder states by initializing the encoder state to match the final K−1 bits of the input sequence.

Figure 9:
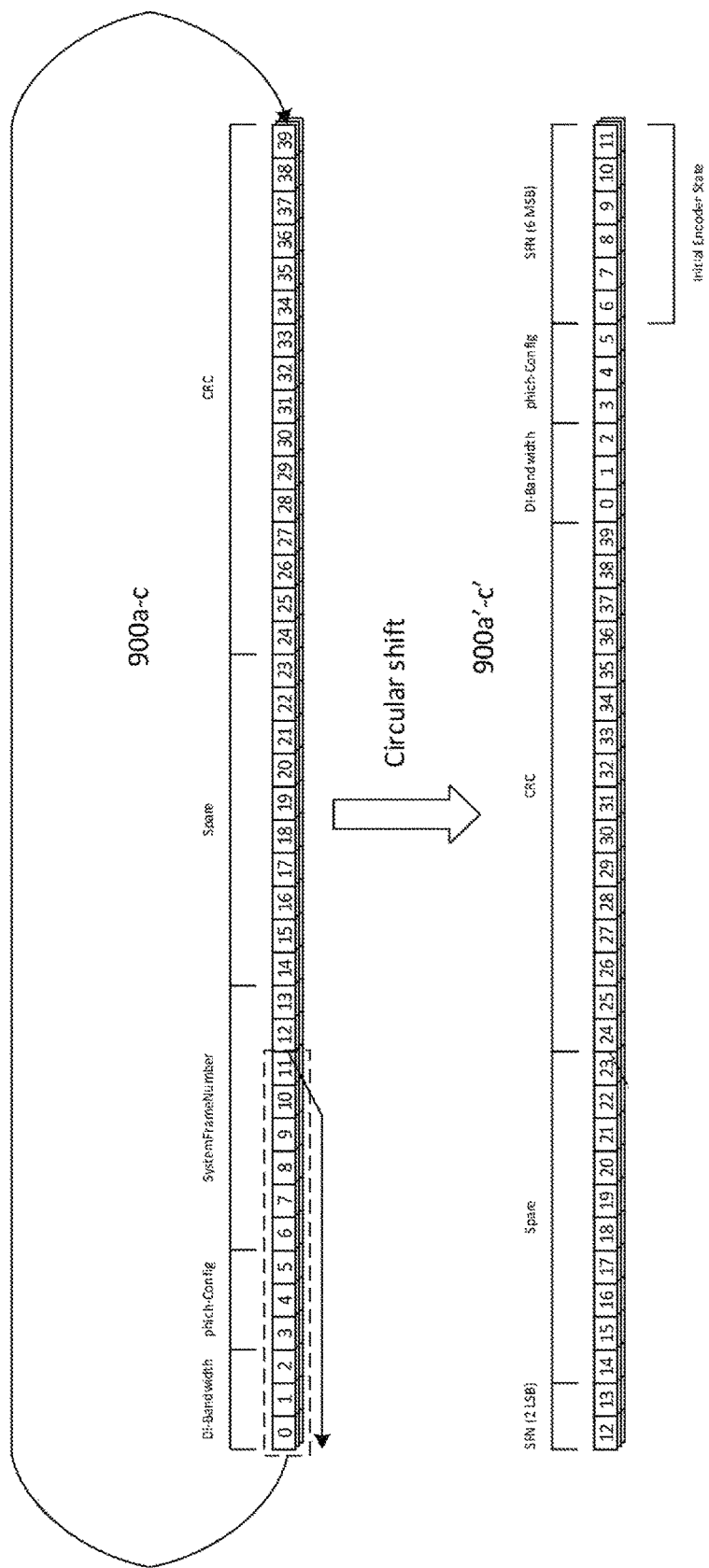
FIG. 9 shows a graphical representation of a cyclic shift of encoded MIB parity bit sequences.

Accordingly, after identifying the SFN field in 820, decoding circuit 306b may isolate a second set of encoded MIB parity bit sequences corresponding to another cell, e.g. network cell 204a, from the composite encoded MIB parity bit sequences in a second SIC iteration. In order to employ the identified SFN from 820 as the initial encoder state for Viterbi TBCC decoding of the encoded MIB parity bit sequences for network cell 204a, decoder circuit 306b may first preprocess the encoded MIB parity bit sequences by cyclically shifting the encoded MIB parity bit sequences in 830. As decoder circuit 306b will utilize the identified SFN contained in original MIB bits 6-13 as the initial encoder state, decoder circuit 306b may cyclically shift the encoded MIB parity bit sequences to position the SFN field (MIB bits 6-13) at the end of the encoded MIB parity bit sequences, thus causing the cyclically-shifted encoded MIB parity bit sequences to have an initial encoder state equal to the SFN field due to the cyclic nature of TBCC codes. FIG. 9 depicts a graphical illustration of such a cyclic shift, where decoding circuit 306b may cyclically shift encoded MIB parity bit sequences 900a-c (e.g. three parity bit sequences produced from a single original MIB) to obtain cyclically shifted encoded MIB parity bit sequences 900a'-c'. In accordance with 3GPP standards, the MIB may be encoded with a constraint length K=7, and accordingly may have an encoder state of K−1=6 bits. As the SFN field is 8 bits, decoder circuit 306b may employ any 6 consecutive bits of the identified SFN field as the initial encoder state, and cyclically shift the encoded MIB parity bit sequences accordingly. The cyclic shift of FIG. 9 depicts an implementation in which decoding circuit 306b utilizes the 6 Most Significant Bits (MSBs) of the SFN field as the initial encoder state.

After preprocessing the encoded MIB parity bit sequences with a cyclic shift in 830, decoder circuit 306b may then perform Viterbi TBCC decoding on the cyclically shifted encoded MIB parity bit sequences with the selected consecutive 6 bits of the SFN field as the initial encoder state. As decoding circuit 306b determined the SFN field in 820 from a previously MIB decode procedure of a synchronized cell, decoder circuit 306b may thus be able to perform the Viterbi TBCC decode with perfect initial and final encoder states. Decoder circuit 306b may thus be able to perform both forward search and traceback with perfect information in 830, and accordingly may obtain superior performance without needing to perform any extra processing in the form of warmup region or right extension processing.

In the exemplary scenario introduced above, decoder circuit 306b may then repeat 830 and 840 on any remaining encoded MIB parity bit sequences of the composite encoded MIB parity bit sequences, e.g. the encoded MIB parity bit sequences received from network cell 208c. Decoder circuit 306b may similarly apply the SFN field identified from the full decode of the encoded MIB parity bit sequences of network cell 206b in 820 in order to initialize the 6-bit encoder state for Viterbi decoding and cyclically shift the encoded MIB parity bit sequences of network cell 208c accordingly.

Method 800 may thus be particularly applicable in the event of SIC procedures for PBCH decoding from synchronous cells that simultaneously transmit MIBs with a common SFN field. As detailed above, decoder circuit 306b may perform a full decode of encoded MIB parity bit sequences received from a first network cell and subsequently utilize the identified SFN field as the initial encoder state to decode encoded MIB parity bit sequences received from a second network cell synchronized with the first network cell (and e.g. a third synchronized network cell, a fourth synchronized network cell, etc.). Although eICIC synchronous cell groups using ABS have been explicitly introduced above, decoder circuit 306b may equivalently employ method 800 to decode multiple synchronized encoded MIB parity bit sequences for any two or more cells that transmit synchronized MIBs. It is also noted that user terminals may be able to determine the SFN field of a set of encoded MIB parity bit sequences by other mechanisms, such as based on a previous connection to a particular cell or a previous connection to any cell in a synchronous cell group. Accordingly, decoding circuit 306b may implement method 800 regardless of the exact procedure used to determine the SFN field of the encoded MIB parity bit sequences in 820.

Although it may be more applicable for decoder circuit 306b to utilize a common SFN field between synchronized cells to optimize MIB decoding, decoder circuit 306b may be able to utilize an MIB field other than the SFN field as the consecutive 6-bit initial encoder state if such information is available. For example, decoder circuit 306b may have previous knowledge of the downlink bandwidth and PHICH configuration of a particular network cell, such as based on a previous connection to the network cell. If such information is available to decoder circuit 306b (which may not require synchronized cells, and may thus be applied for reception of a set of encoded MIB parity bit sequences from only a single cell), decoder circuit 306b may identify the downlink bandwidth (MIB bits 0-2) and PHICH configuration (MIB bits 3-5) and apply the 6-bit combined downlink bandwidth and PHICH configuration fields (e.g. MIB bits 0-5) as the initial encoder state for Viterbi decoding, which may not require a cyclic shift operation due to the initial positioning of the downlink bandwidth field within the MIB.

Decoder circuit 306b may alternatively utilize a "partial" initial encoder state for Viterbi decoding, such as if decoder circuit 306b has knowledge of less than 6 consecutive bits. For example, decoder circuit 306b may be able to identify e.g. the downlink bandwidth field of an original MIB corresponding to a received set of encoded MIB parity bit sequences. Decoder circuit 306b may thus be able to determine 3 bits of the original MIB, and accordingly may be able to utilize the identified 3 bits as 3 bits of a "partial" initial encoder state. Decoder circuit 306b may then be able to limit the possible initial encoder states based on such partial information, where e.g. knowledge of 3 bits for a constraint length K=7 encoder may reduce the possible initial encoder states from 64 possibilities to 32 possibilities.

Upon completion of method 800 (including decoding of all eligible TBCC-encoded MIB sequences), PHY circuit 306a may provide the decoded MIB information to control circuit 306c, which may proceed to manage wireless communication operations of mobile terminal 202 based on the decoded MIB information. For example, PHY circuit 306a may provide MIB information to control circuit 306c for each network cell that provides a set of encoded MIB parity bit sequences that is decoded by decoding circuit 306a. Control circuit 306c may then further interact with each network cell based on the decoded MIB information, which may include receiving additional system information (e.g. SIB1 and SIB2) from each network cell as part of a cell search procedure and subsequently selecting (or re-selecting) a serving cell based on the system information and/or cell measurements.

Decoding circuit 306b may repeat method 800 during each occasion that mobile terminal 202 performs MIB detection, which may be controlled and triggered by control circuit 306c according to control logic of the protocol stack executed by control circuit 306c.

Figure 10:
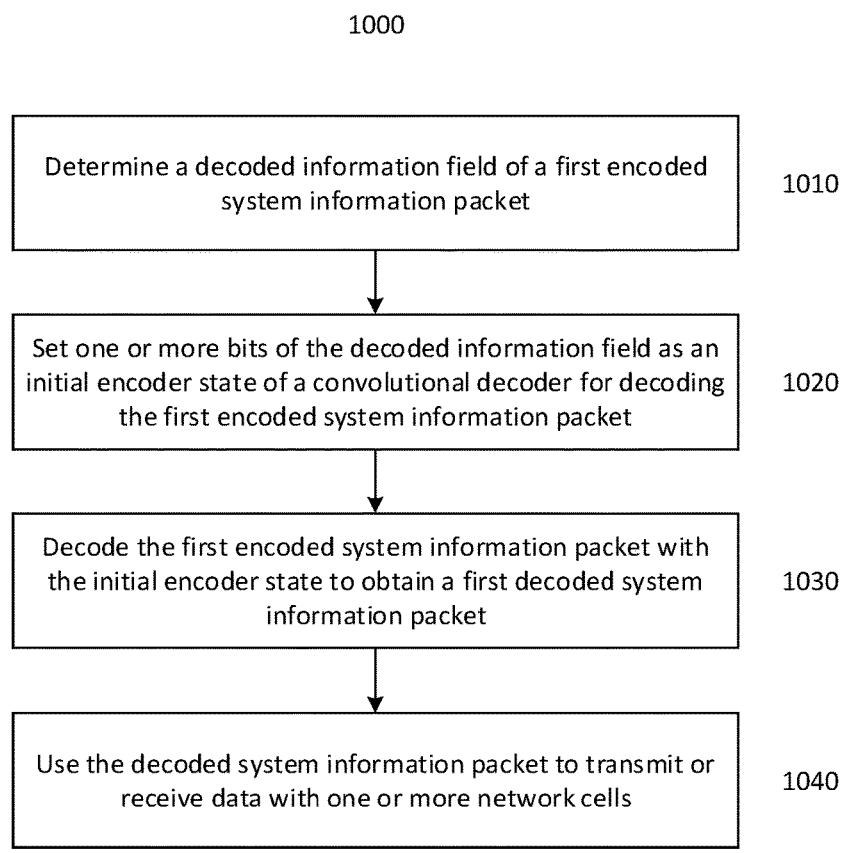
FIG. 10 shows a first method for decoding system information packets.

FIG. 10 shows a flow chart illustrating method 1000 of decoding system information packets. As shown in FIG. 10, method 1000 includes determining a decoded information field of a first encoded system information packet; setting one or more bits of the decoded information field as an initial encoder state of a convolutional decoder for decoding the first encoded system information packet; decoding the first encoded system information packet with the initial encoder state to obtain a first decoded system information packet; and applying the decoded system information packet to transmit or receive data with one or more network cells.

In one or more further exemplary aspects of the disclosure, one or more of the features described above in reference to FIGS. 1-9 may be further incorporated into method 1000. In particular, method 1000 may be configured to perform further and/or alternate processes as detailed regarding mobile terminal 202, RF transceiver 304, and/or baseband modem 306.

Figure 11:
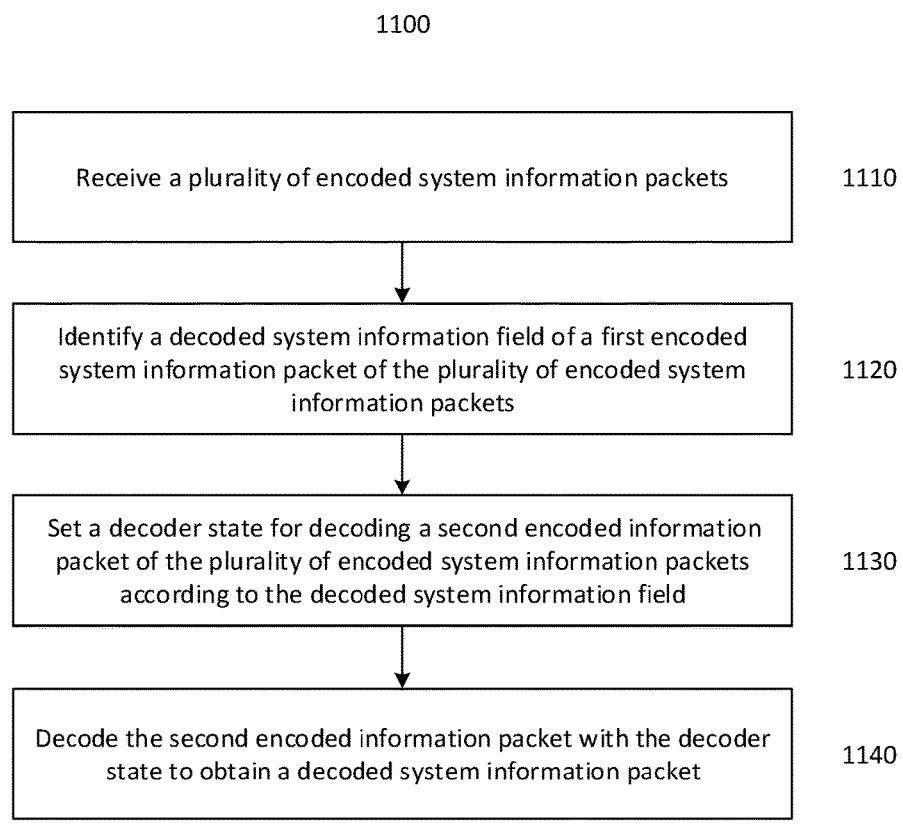
FIG. 11 shows a second method for decoding system information packets.

FIG. 11 shows a flow chart illustrating method 1100 of decoding system information. As shown in FIG. 11, method 1100 includes receiving a plurality of encoded system information packets of a first type, identifying a decoded system information field of a first encoded system information packet of the plurality of encoded system information packets, setting a decoder state for decoding a second encoded information packet of the plurality of encoded system information packets according to the decoded system information field, and decoding the second encoded information packet with the decoder state to obtain a decoded system information packet.

In one or more further exemplary aspects of the disclosure, one or more of the features described above in reference to FIGS. 1-9 may be further incorporated into method 1100. In particular, method 1100 may be configured to perform further and/or alternate processes as detailed regarding mobile terminal 202, RF transceiver 304, and/or baseband modem 306.

Accordingly, a mobile terminal may optimize decoding of TBCC-encoded MIB parity bit sequences by identifying bits of the original MIB and apply the identified bits of the original MIB as a priori information to initialize a decoder state, e.g. the assumed initial encoder state during Viterbi decoding. As TBCC codes are cyclical, a mobile terminal may apply any bits of the original MIB and perform an appropriate cyclic shift of the encoded MIB parity bit sequences to begin decoding at a point in the encoded MIB parity bit sequences having the initial encoder state. Such may be particularly applicable in MIB decoding for synchronized cells, where a mobile terminal may identify the common SFN field by decoding the MIB for a first cell of the synchronized cells (e.g. during a first SIC iteration) and applying the common SFN field as the initial encoder state to decode MIBs for the remaining synchronized cells. However, it is appreciated that such is not expressly limited to common SFN fields and/or synchronized cells, and that a mobile terminal may initialize a Viterbi decoder for MIB decoding using any identified bits of the original MIB, which may even include "partial" initial encoder states. A mobile terminal may thus improve the accuracy of Viterbi decoding from the use of perfect information and reduce extra processing, such as for warm-up regions and right extensions.

It is appreciated that the terms "user equipment", "UE", "mobile terminal", etc., may apply to any wireless communication device, including cellular phones, tablets, laptops, personal computers, wearables, multimedia playback devices, consumer/home appliances, vehicles, etc., and any number of additional electronic devices capable of wireless communications.

The following examples pertain to further aspects of the disclosure:

Example 1 is a method for decoding system information packets, the method including determining a decoded information field of a first encoded system information packet, setting one or more bits of the decoded information field as an initial encoder state of a convolutional decoder for decoding the first encoded system information packet, decoding the first encoded system information packet with the initial encoder state to obtain a first decoded system information packet, and using the decoded system information packet to transmit or receive data with one or more network cells.

In Example 2, the subject matter of Example 1 can optionally include wherein the decoding the first encoded system information packet with the initial encoder state to obtain a first decoded system information packet includes sequentially decoding the first encoded system information packet starting with the initial encoder state.

In Example 3, the subject matter of Example 1 can optionally include wherein the decoding the first encoded system information packet with the initial encoder state to obtain a first decoded system information packet includes sequentially decoding the first encoded system information packet using Viterbi decoding starting with the initial encoder state.

In Example 4, the subject matter of Example 2 or 3 can optionally further include circularly shifting the first encoded system information packet according to the initial encoder state.

In Example 5, the subject matter of any one of Examples 1 to 4 can optionally further include receiving a plurality of encoded system information packets including the first encoded system information packet.

In Example 6, the subject matter of Example 5 can optionally include wherein the receiving a plurality of encoded system information packets including the first encoded system information packet includes simultaneously receiving the plurality of encoded system information packets from a plurality of synchronized network cells.

In Example 7, the subject matter of Example 5 or 6 can optionally include wherein the plurality of encoded system information packets include the same system information packet type.

In Example 8, the subject matter of any one of Examples 5 to 7 can optionally include wherein the plurality of encoded system information packets are encoded Master Information Blocks (MIBs).

In Example 9, the subject matter of any one of Examples 5 to 8 can optionally include wherein each of the plurality of encoded system information packets contain the decoded system information field.

In Example 10, the subject matter of any one of Examples 5 to 9 can optionally include wherein the determining a decoded information field of a first encoded system information packet includes decoding a second encoded system information packet of the plurality of encoded system information packets to obtain a second decoded system information packet, wherein the decoded information field is an information field of the second decoded system information packet.

In Example 11, the subject matter of Example 10 can optionally include wherein the decoding a second encoded system information packet of the plurality of encoded system information packets to obtain a second decoded system information packet includes decoding the second encoded system information packet during a first interference cancelation iteration, and wherein the decoding the first encoded system information packet with the initial encoder state to obtain a first decoded system information packet includes decoding the first encoded system information packet during a second interference cancelation iteration occurring after the first interference cancelation iteration.

In Example 12, the subject matter of Example 11 can optionally include wherein the first interference cancelation iteration and the second interference cancelation iteration are stages of a Successive Interference Cancelation (SIC) procedure.

In Example 13, the subject matter of any one of Examples 10 to 12 can optionally include wherein the receiving a plurality of encoded system information packets including the first encoded system information packet includes receiving the plurality of encoded system information packets from a plurality of network cells.

In Example 14, the subject matter of Example 13 can optionally include wherein the plurality of network cells are a plurality of synchronized network cells.

In Example 15, the subject matter of any one of Examples 10 to 12 can optionally include wherein the receiving a plurality of encoded system information packets including the first encoded system information packet includes receiving the plurality of encoded system information packets from a plurality of synchronized network cells.

In Example 6, the subject matter of any one of Examples 1 to 15 can optionally further include performing a circular shift of the first encoded system information packet, and wherein the decoding the first encoded system information packet with the initial encoder state to obtain a first decoded system information packet includes decoding the circularly-shifted first encoded system information packet with the initial encoder state to obtain the first decoded system information packet.

In Example 7, the subject matter of any one of Examples 1 to 16 can optionally include wherein the decoding the first encoded system information packet with the initial encoder state to obtain a first decoded system information packet includes decoding the first encoded system information packet using Viterbi decoding with the initial encoder state.

In Example 18, the subject matter of any one of Examples 1 to 17 can optionally include wherein the first encoded system information packet is a Tail-Biting Convolutional Code (TBCC)-encoded system information packet.

In Example 19, the subject matter of any one of Examples 1 to 18 can optionally include wherein the decoded information field is a System Frame Number (SFN) field.

In Example 20, the subject matter of any one of Examples 1 to 19 can optionally include wherein the first encoded system information packet is a convolutional encoded system information packet.

In Example 21, the subject matter of any one of Examples 1 to 20 can optionally include wherein the using the decoded system information packet to transmit or receive data with one or more network cells includes performing cell search or selection with information of the decoded system information packet.

In Example 22, the subject matter of any one of Examples 1 to 20 can optionally include wherein the first encoded system information packet is an encoded Master Information Block (MIB).

Example 23 is a communication circuit configured to perform the method of any one of Examples 1 to 22.

Example 24 is a mobile communication device including a radio transceiver and a communication circuit configured to interact with the radio transceiver to transmit and receive radio signals, the communication circuit configured to perform the method of any one of Examples 1 to 22.

Example 25 is a non-transitory computer readable medium storing instructions that when executed by a processor cause the processor to perform the method of any one of Examples 1 to 22.

Example 26 is a method for decoding system information packets, the method including receiving a plurality of encoded system information packets, identifying a decoded system information field of a first encoded system information packet of the plurality of encoded system information packets, setting a decoder state for decoding a second encoded information packet of the plurality of encoded system information packets according to the decoded system information field, and decoding the second encoded information packet with the decoder state to obtain a decoded system information packet.

In Example 27, the subject matter of Example 26 can optionally include wherein the receiving a plurality of encoded system information packets includes simultaneously receiving the plurality of encoded system information packets from a plurality of synchronized network cells.

In Example 28, the subject matter of Example 26 or 27 can optionally further include using the decoded system information packet to transmit or receive data with one or more network cells.

In Example 29, the subject matter of Example 26 or 27 can optionally further include performing cell search or selection with information contained in the decoded system information packet.

In Example 30, the subject matter of any one of Examples 26 to 29 can optionally include wherein the plurality of encoded system information packets include the same system information packet type.

In Example 31, the subject matter of any one of Examples 26 to 30 can optionally include wherein the decoding the second encoded information packet with the decoder state to obtain a decoded system information packet includes sequentially decoding the second encoded information packet starting with the initial encoder state.

In Example 32, the subject matter of any one of Examples 26 to 30 can optionally include wherein the decoding the second encoded information packet with the decoder state to obtain a decoded system information packet includes sequentially decoding the first encoded system information packet starting using Viterbi decoding with the initial encoder state.

In Example 33, the subject matter of Example 31 or 32 can optionally further include circularly shifting the first encoded system information packet according to the initial encoder state.

In Example 34, the subject matter of any one of Examples 26 to 33 can optionally include wherein the plurality of encoded system information packets are encoded Master Information Block (MIBs).

In Example 35, the subject matter of any one of Examples 26 to 34 can optionally include wherein each of the plurality of encoded system information packets contain the decoded system information field.

In Example 36, the subject matter of any one of Examples 26 to 35 can optionally include wherein the identifying a decoded system information field of a first encoded system information packet of the plurality of encoded system information packets includes decoding the first encoded system information packet of the plurality of system information packets to obtain an additional decoded system information packet, wherein the decoded system information field is an information field of the additional decoded system information packet.

In Example 37, the subject matter of Example 36 can optionally include wherein the decoding the first encoded system information packet of the plurality of system information packets to obtain an additional decoded system information packet includes decoding the first encoded system information packet during a first interference cancelation iteration, and wherein the decoding the second encoded information packet with the decoder state to obtain a first decoded system information packet includes decoding the second encoded information packet during a second interference cancelation iteration occurring after the first interference calculation iteration.

In Example 38, the subject matter of Example 37 can optionally include wherein the first interference cancelation iteration and the second interference cancelation iteration are stages of a Successive Interference Cancelation (SIC) procedure.

In Example 39, the subject matter of any one of Examples 36 to 38 can optionally include wherein the receiving a plurality of encoded system information packets includes receiving the plurality of encoded system information packets from a plurality of network cells.

In Example 40, the subject matter of any one of Examples 36 to 38 can optionally include wherein the receiving a plurality of encoded system information packets includes receiving the plurality of encoded system information packets from a plurality of synchronized network cells.

In Example 41, the subject matter of any one of Examples 26 to 40 can optionally further include performing a circular shift of the second encoded system information packet, and wherein the decoding the second encoded system information packet with the decoder state to obtain a decoded system information packet includes decoding the circularly shifted second encoded system information packet to obtain the decoded system information packet.

In Example 42, the subject matter of any one of Examples 26 to 41 can optionally include wherein the decoding the second encoded information packet with the decoder state to obtain a decoded system information packet includes decoding the second encoded system information packet using Viterbi decoding with the decoder state as an initial encoder state.

In Example 43, the subject matter of any one of Examples 26 to 42 can optionally include wherein the second encoded system information packet is a Tail-Biting Convolutional Code (TBCC)-encoded system information packet.

In Example 44, the subject matter of any one of Examples 26 to 43 can optionally include wherein the decoded information field is a System Frame Number (SFN) field of the second encoded system information packet.

In Example 45, the subject matter of any one of Examples 26 to 44 can optionally include wherein each of the plurality of encoded system information packets contains the same System Frame Number (SFN) field.

In Example 46, the subject matter of any one of Examples 26 to 44 can optionally include wherein the second encoded system information packet is a convolutional encoded system information packet.

In Example 47, the subject matter of any one of Examples 26 to 46 can optionally include wherein the second encoded system information packet is an encoded Master Information Block (MIB).

Example 48 is a communication circuit configured to perform the method of any one of Examples 26 to 47.

Example 49 is a mobile communication device including a radio transceiver and a communication circuit configured to interact with the radio transceiver to transmit and receive radio signals, the communication circuit configured to perform the method of any one of Examples 26 to 47.

Example 50 is a non-transitory computer readable medium storing instructions that when executed by a processor cause the processor to perform the method of any one of Examples 26 to 47.

Example 51 is a mobile communication device including a radio transceiver configured to transmit and receive communication signals, and a baseband modem circuit configured to determine a decoded information field of a first encoded system information packet, set one or more bits of the decoded information field as an initial encoder state of a convolutional decoder for decoding the first encoded system information packet, decode the first encoded system information packet with the initial encoder state to obtain a first decoded system information packet, and apply the decoded system information packet to transmit or receive data with one or more network cells.

In Example 52, the subject matter of Example 51 can optionally include wherein the baseband modem circuit is configured to sequentially decode the first encoded system information packet starting with the initial encoder state to decode the first encoded system information packet.

In Example 53, the subject matter of Example 51 can optionally include wherein the baseband modem circuit is configured to sequentially decode the first encoded system information packet with Viterbi decoding starting with the initial encoder state to decode the first encoded system information packet.

In Example 54, the subject matter of Example 51 can optionally include wherein the baseband modem is further configured to circularly shift the first encoded system information packet according to the initial encoder state.

In Example 55, the subject matter of any one of Examples 51 to 54 can optionally include wherein the radio transceiver is further configured to receive a plurality of encoded system information packets including the first encoded system information packet.

In Example 56, the subject matter of Example 55 can optionally include wherein the baseband modem circuit is configured to simultaneously receive the plurality of encoded system information packets from a plurality of synchronized network cells to receive the plurality of encoded system information packets.

In Example 57, the subject matter of Example 55 or 56 can optionally include wherein the plurality of encoded system information packets include the same system information packet type.

In Example 58, the subject matter of any one of Examples 55 to 57 can optionally include wherein the plurality of encoded system information packets are encoded Master Information Blocks (MIBs).

In Example 59, the subject matter of any one of Examples 55 to 58 can optionally include wherein each of the plurality of encoded system information packets contain the decoded system information field.

In Example 60, the subject matter of any one of Examples 55 to 59 can optionally include wherein the baseband modem circuit is configured to determine the decoded information field of the first encoded system information packet by decoding a second encoded system information packet of the plurality of encoded system information packets to obtain a second decoded system information packet, wherein the decoded information field is an information field of the second decoded system information packet.

In Example 61, the subject matter of Example 60 can optionally include wherein the baseband modem circuit is configured to decode the second encoded system information packet of the plurality of encoded system information packets to obtain the second decoded system information packet by decoding the second encoded system information packet during a first interference cancelation iteration, and wherein the decoding the first encoded system information packet with the initial encoder state to obtain a first decoded system information packet includes decoding the first encoded system information packet during a second interference cancelation iteration occurring after the first interference cancelation iteration.

In Example 62, the subject matter of Example 61 can optionally include wherein the baseband modem circuit is configured to perform the first interference cancelation iteration and the second interference cancelation iteration as stages of a Successive Interference Cancelation (SIC) procedure.

In Example 63, the subject matter of any one of Examples 60 to 62 can optionally include wherein the radio transceiver is configured to receive the plurality of encoded system information packets from a plurality of network cells.

In Example 64, the subject matter of Example 63 can optionally include wherein the plurality of network cells are a plurality of synchronized network cells.

In Example 65, the subject matter of any one of Examples 60 to 62 can optionally include wherein the radio transceiver is configured to receive the plurality of encoded system information packets from a plurality of synchronized network cells.

In Example 66, the subject matter of any one of Examples 51 to 65 can optionally include wherein the baseband modem circuit is further configured to perform a circular shift of the first encoded system information packet, and wherein the baseband modem circuit is configured to decode the circularly-shifted first encoded system information packet with the initial encoder state to obtain the first decoded system information packet.

In Example 67, the subject matter of any one of Examples 51 to 66 can optionally include wherein the baseband modem circuit is configured to apply Viterbi decoding to decode the first encoded system information packet with the initial encoder state to obtain the first decoded system information packet.

In Example 68, the subject matter of any one of Examples 51 to 67 can optionally include wherein the first encoded system information packet is a Tail-Biting Convolutional Code (TBCC)-encoded system information packet.

In Example 69, the subject matter of any one of Examples 51 to 68 can optionally include wherein the decoded information field is a System Frame Number (SFN) field.

In Example 70, the subject matter of any one of Examples 51 to 69 can optionally include wherein the first encoded system information packet is a convolutional encoded system information packet.

In Example 71, the subject matter of any one of Examples 51 to 70 can optionally include wherein the baseband modem circuit is configured to perform cell search or selection with information of the decoded system information packet to apply the decoded system information packet to transmit or receive data with one or more network cells.

In Example 72, the subject matter of any one of Examples 51 to 71 can optionally include wherein the first encoded system information packet is an encoded Master Information Block (MIB).

Example 73 is a mobile communication device including a radio transceiver configured to receive a plurality of encoded system information packets, and a baseband modem circuit configured to identify a decoded system information field of a first encoded system information packet of the plurality of encoded system information packets, set a decoder state for decoding a second encoded information packet of the plurality of encoded system information packets according to the decoded system information field, and decode the second encoded information packet with the decoder state to obtain a decoded system information packet.

In Example 74, the subject matter of Example 73 can optionally include wherein the radio transceiver is configured to simultaneously receive the plurality of encoded system information packets from a plurality of synchronized network cells.

In Example 75, the subject matter of Example 73 or 74 can optionally include wherein the baseband modem circuit is further configured to transmit or receive data with one or more network cells.

In Example 76, the subject matter of Example 73 or 74 can optionally include wherein the baseband modem circuit is further configured to perform cell search or selection with information contained in the decoded system information packet.

In Example 77, the subject matter of any one of Examples 73 to 76 can optionally include wherein the plurality of encoded system information packets include the same system information type.

In Example 78, the subject matter of any one of Examples 73 to 77 can optionally include wherein the baseband modem circuit is configured to sequentially decode the second encoded information packet starting with the initial encoder state.

In Example 79, the subject matter of any one of Examples 73 to 77 can optionally include wherein the baseband modem circuit is configured to perform Viterbi decoding to sequentially decode the first encoded system information packet starting with the initial encoder state.

In Example 80, the subject matter of Example 78 or 79 can optionally include wherein the baseband modem circuit is further configured to circularly shift the first encoded system information packet according to the initial encoder state.

In Example 81, the subject matter of any one of Examples 73 to 80 can optionally include wherein the plurality of encoded system information packets are encoded Master Information Block (MIBs).

In Example 82, the subject matter of any one of Examples 73 to 81 can optionally include wherein the baseband modem circuit is configured to identify the decoded system information field of a first decoded system information packet of the plurality of encoded system information packets by decoding the first encoded system information packet of the plurality of system information packets to obtain an additional decoded system information packet, wherein the decoded system information field is an information field of the additional decoded system information packet.

In Example 83, the subject matter of Example 82 can optionally include wherein baseband modem circuit is configured to decode the first encoded system information packet of the plurality of system information packets to obtain an additional decoded system information packet by decoding the first encoded system information packet during a first interference cancelation iteration, and wherein the decoding the second encoded information packet with the decoder state to obtain a first decoded system information packet includes decoding the second encoded information packet during a second interference cancelation iteration occurring after the first interference calculation iteration.

In Example 84, the subject matter of Example 83 can optionally include wherein the baseband modem circuit is configured to perform the first interference cancelation iteration and the second interference cancelation iteration as stages of a Successive Interference Cancelation (SIC) procedure.

In Example 85, the subject matter of any one of Examples 82 to 84 can optionally include wherein the radio transceiver is configured to receive the plurality of encoded system information packets from a plurality of network cells.

In Example 86, the subject matter of any one of Examples 82 to 84 can optionally include wherein the radio transceiver is configured to receive the plurality of encoded system information packets from a plurality of synchronized network cells.

In Example 87, the subject matter of any one of Examples 73 to 86 can optionally include wherein the baseband modem circuit is further configured to perform a circular shift of the second encoded system information packet, and wherein the baseband modem circuit is configured to decode the circularly-shifted second encoded system information packet to decode the second encoded system information packet with the decoder state to obtain the decoded system information.

In Example 88, the subject matter of any one of Examples 73 to 86 can optionally include wherein the baseband modem circuit is configured to apply Viterbi decoding to decode the second encoded system information with the decoder state as an initial decoder state to decode the second encoded information packet to obtain the decoded system information packet.

In Example 89, the subject matter of any one of Examples 73 to 88 can optionally include wherein the second encoded information packet is a Tail-Biting Convolutional Code (TBCC)-encoded system information packet.

In Example 90, the subject matter of any one of Examples 73 to 89 can optionally include wherein the decoded information field is a System Frame Number (SFN) field of the second encoded system information packet.

In Example 91, the subject matter of any one of Examples 73 to 90 can optionally include wherein each of the plurality of encoded system information packets contain the decoded system information field.

In Example 92, the subject matter of any one of Examples 73 to 90 can optionally include wherein the second encoded information packet is a convolutional encoded system information packet.

In Example 93, the subject matter of any one of Examples 73 to 92 can optionally include wherein the second encoded system information packet is an encoded Master Information Block (MIB).

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include a one or more components configured to perform each aspect of the related method.

All acronyms defined in the above description additionally hold in all claims included herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A mobile communication device comprising:
   a radio transceiver configured to transmit and receive communication signals; and
   a baseband modem circuit configured to:
   determine a decoded information field of a first encoded system information packet by decoding a second encoded system information packet of a plurality of encoded system information packets; wherein the decoded information field of the first encoded system information packet is an information field of the second decoded system information packet;
   set one or more bits of the decoded information field as an initial encoder state of a convolutional decoder for decoding the first encoded system information packet;
   decode the first encoded system information packet with the initial encoder state to obtain a first decoded system information packet; and
   apply the decoded system information packet of the first encoded system information packet to transmit or receive data with one or more network cells.

2. The mobile communication device of claim 1, wherein the baseband modem circuit is configured to sequentially decode the first encoded system information packet starting with the initial encoder state to decode the first encoded system information packet.

3. The mobile communication device of claim 1, wherein the baseband modem circuit is configured to sequentially decode the first encoded system information packet with Viterbi decoding starting with the initial encoder state to decode the first encoded system information packet.

4. The mobile communication device of claim 1, wherein the radio transceiver is further configured to receive a plurality of encoded system information packets including the first encoded system information packet.

5. The mobile communication device of claim 1, wherein the radio transceiver is configured to receive a plurality of encoded system information packets from a plurality of synchronized network cells.

6. The mobile communication device of claim 5, wherein the baseband modem circuit is further configured to perform a circular shift of the first encoded system information packet, and wherein the baseband modem circuit is configured to decode the circularly-shifted first encoded system information packet with the initial encoder state to obtain the first decoded system information packet.

7. The mobile communication device of claim 1, wherein the first encoded system information packet is a Tail-Biting Convolutional Code (TBCC)-encoded system information packet.

8. The mobile communication device of claim 1, wherein the decoded information field is a System Frame Number (SFN) field.

9. The mobile communication device of claim 1, wherein the first encoded system information packet is an encoded Master Information Block (MIB).

10. A mobile communication device comprising:
a radio transceiver configured to receive a plurality of encoded system information packets; and
a baseband modem circuit configured to:
identify a decoded system information field of a first encoded system information packet of the plurality of encoded system information packets by identifying a second encoded system information packet of a plurality of encoded system information packets;
set a decoder state for decoding a second encoded information packet of the plurality of encoded system information packets according to the decoded system information field; and
decode the second encoded information packet with the decoder state to obtain a decoded system information packet; wherein the decoded information field of the first encoded system information packet is an information field of the second decoded system information packet.

11. The mobile communication device of claim 10, wherein the baseband modem circuit is further configured to perform cell search or selection with information contained in the decoded system information packet.

12. The mobile communication device of claim 10, wherein the baseband modem circuit is configured to perform Viterbi decoding to sequentially decode the first encoded system information packet starting with the initial encoder state.

13. The mobile communication device of claim 10, wherein the plurality of encoded system information packets are encoded Master Information Block (MIBs).

14. The mobile communication device of claim 10, wherein the second encoded information packet is a Tail-Biting Convolutional Code (TBCC)-encoded system information packet.

15. A method for decoding system information packets, the method comprising:
determining a decoded information field of a first encoded system information packet;
setting one or more bits of the decoded information field as an initial encoder state of a convolutional decoder for decoding the first encoded system information packet;
decoding the first encoded system information packet with the initial encoder state to obtain a first decoded system information packet of a plurality of encoded system information packets;
decoding a second encoded system information packet of the plurality of encoded system information packets; wherein the decoded information field of the first encoded system information packet is an information field of the second decoded system information packet; and
using the decoded system information packet of the first encoded system information packet to transmit or receive data with one or more network cells.

16. The method of claim 15, wherein the decoding the first encoded system information packet with the initial encoder state to obtain a first decoded system information packet comprises:
sequentially decoding the first encoded system information packet using Viterbi decoding starting with the initial encoder state.

17. The method of claim 15, wherein the first encoded system information packet is a Tail-Biting Convolutional Code (TBCC)-encoded system information packet.

18. The method of claim 15, wherein the decoded information field is a System Frame Number (SFN) field.

19. The method of claim 15, wherein the first encoded system information packet is an encoded Master Information Block (MIB).

* * * * *